(12) United States Patent
Chang Chien et al.

(10) Patent No.: US 11,545,424 B2
(45) Date of Patent: Jan. 3, 2023

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/952,084

(22) Filed: Nov. 19, 2020

(65) Prior Publication Data

US 2021/0202437 A1 Jul. 1, 2021

Related U.S. Application Data

(60) Provisional application No. 62/955,456, filed on Dec. 31, 2019.

(51) Int. Cl.
*H01L 21/48* (2006.01)
*H01L 23/498* (2006.01)
(Continued)

(52) U.S. Cl.
CPC ...... *H01L 23/49838* (2013.01); *H01L 21/481* (2013.01); *H01L 21/4853* (2013.01);
(Continued)

(58) Field of Classification Search
CPC ....... H01L 25/0655; H01L 2224/16146; H01L 2224/16147; H01L 2224/16151;
(Continued)

(56) References Cited

U.S. PATENT DOCUMENTS 10,340,253 B2 * 7/2019 Liao .................... H01L 23/3114
2018/0005987 A1 * 1/2018 Hiner .................. H01L 23/5385
(Continued)

FOREIGN PATENT DOCUMENTS

EP 3208848 8/2017

*Primary Examiner* — Nicholas J Tobergte
*Assistant Examiner* — William H Anderson
(74) *Attorney, Agent, or Firm* — JCIPRNET

(57) ABSTRACT

A package structure including a redistribution circuit structure, an insulator, a plurality of conductive connection pieces, a first chip, a second chip, an encapsulant, a third chip, and a plurality of conductive terminals is provided. The redistribution circuit structure has first and second connection surfaces opposite to each other. The insulator is embedded in and penetrates the redistribution circuit structure. The conductive connection pieces penetrate the insulator. The first and second chips are disposed on the first connection surface. The encapsulant is disposed on the redistribution circuit structure and at least laterally covers the first and second chips. The third chip is disposed on the second connection surface and electrically connected to the first and second chips through the conductive connection pieces. The conductive terminals are disposed on the second connection surface and electrically connected to the first chip or the second chip through the redistribution circuit structure.

14 Claims, 14 Drawing Sheets

(51) Int. Cl.
| | |
|---|---|
| *H01L 23/00* | (2006.01) |
| *H01L 25/18* | (2006.01) |
| *H01L 21/56* | (2006.01) |
| *H01L 21/683* | (2006.01) |
| *H01L 25/065* | (2006.01) |
| *H01L 25/16* | (2006.01) |
| *H01L 25/00* | (2006.01) |
| *H01L 23/31* | (2006.01) |
| *H01L 23/538* | (2006.01) |
| *H01L 23/24* | (2006.01) |
| *H01L 21/78* | (2006.01) |
| *H01L 23/16* | (2006.01) |
| *H01L 23/367* | (2006.01) |
| *H01L 23/552* | (2006.01) |

(52) U.S. Cl.
CPC .......... *H01L 21/4857* (2013.01); *H01L 21/56* (2013.01); *H01L 21/565* (2013.01); *H01L 21/568* (2013.01); *H01L 21/6835* (2013.01); *H01L 21/78* (2013.01); *H01L 23/16* (2013.01); *H01L 23/24* (2013.01); *H01L 23/31* (2013.01); *H01L 23/3128* (2013.01); *H01L 23/3675* (2013.01); *H01L 23/49811* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 23/562* (2013.01); *H01L 24/05* (2013.01); *H01L 24/13* (2013.01); *H01L 24/14* (2013.01); *H01L 24/16* (2013.01); *H01L 24/17* (2013.01); *H01L 25/0652* (2013.01); *H01L 25/0655* (2013.01); *H01L 25/16* (2013.01); *H01L 25/18* (2013.01); *H01L 25/50* (2013.01); *H01L 21/561* (2013.01); *H01L 23/552* (2013.01); *H01L 2221/68359* (2013.01); *H01L 2224/02311* (2013.01); *H01L 2224/02313* (2013.01); *H01L 2224/02379* (2013.01); *H01L 2224/02381* (2013.01); *H01L 2224/13024* (2013.01); *H01L 2224/16145* (2013.01); *H01L 2224/16227* (2013.01); *H01L 2224/1716* (2013.01)

(58) Field of Classification Search
CPC . H01L 2224/16167; H01L 2224/16227; H01L 2224/13235; H01L 2224/16237; H01L 23/31–3192; H01L 25/0652–0657; H01L 2224/0231–0236
See application file for complete search history.

(56) References Cited

U.S. PATENT DOCUMENTS

| | | | |
|---|---|---|---|
| 2018/0026019 A1* | 1/2018 | Tao | H01L 25/105 |
| | | | 257/668 |
| 2018/0061741 A1* | 3/2018 | Beyne | H01L 23/538 |
| 2018/0068978 A1 | 3/2018 | Jeng et al. | |
| 2019/0287904 A1 | 9/2019 | Seidemann et al. | |
| 2021/0134781 A1* | 5/2021 | Chan | H01L 24/05 |

\* cited by examiner

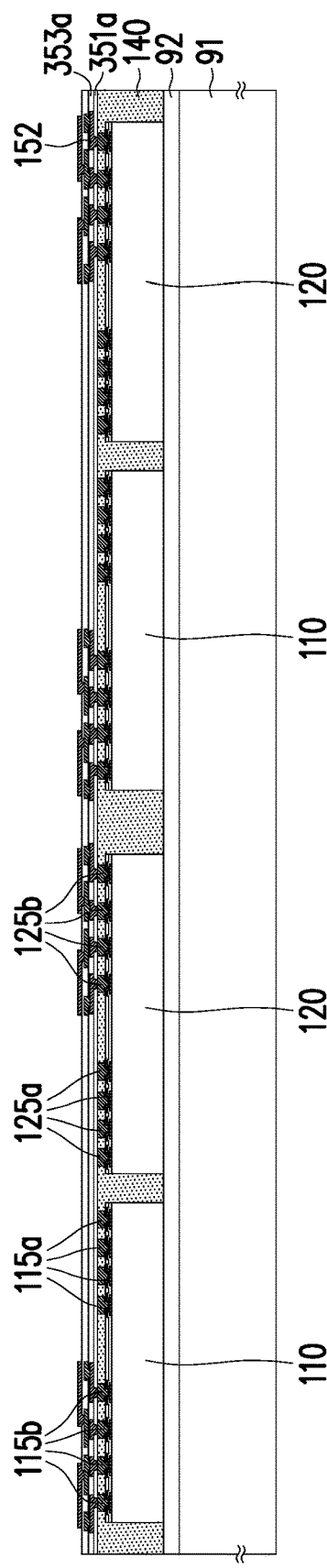
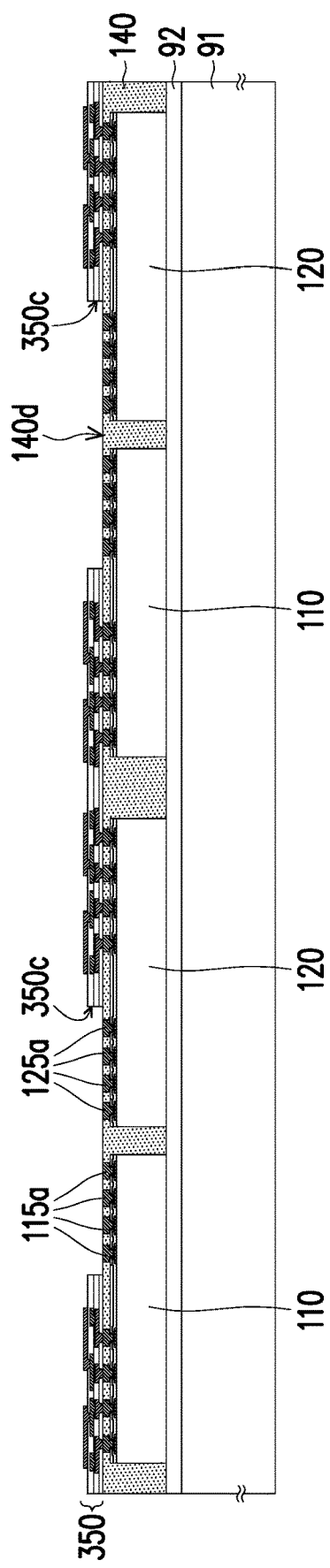

PACKAGE STRUCTURE AND MANUFACTURING METHOD THEREOF

CROSS-REFERENCE TO RELATED APPLICATION

This application claims the priority benefit of U.S. provisional application No. 62/955,456, filed on Dec. 31, 2019. The entirety of the above-mentioned patent application is hereby incorporated by reference herein and made a part of this specification.

TECHNICAL FIELD

The invention relates to a package structure and a manufacturing method, and more particularly, to a package structure having a plurality of chips and a manufacturing method thereof.

BACKGROUND

In recent years, electronic devices have become increasingly important to human life. In order to accelerate the integration of various functions, multiple active chips can be integrated into one package structure. Therefore, how to improve signal transmission quality or efficiency between the chips has become an urgent issue to be solved.

SUMMARY

The invention provides a package structure and a manufacturing method thereof, which can provide better signal transmission quality or efficiency between multiple chips.

The package structure of the invention includes a redistribution circuit structure, an insulator, a plurality of conductive connection pieces, a first chip, a second chip, an encapsulant, a third chip, and a plurality of conductive terminals. The redistribution circuit structure has a first connection surface and a second connection surface opposite to the first connection surface. The insulator is embedded in and penetrates the redistribution circuit structure. The conductive connection pieces penetrate the insulator. The first chip is disposed on the first connection surface of the redistribution circuit structure. The second chip is disposed on the first connection surface of the redistribution circuit structure. The encapsulant is disposed on the redistribution circuit structure and at least laterally covers the first chip and the second chip. The third chip is disposed on the second connection surface of the redistribution circuit structure. The third chip is electrically connected to the first chip and the second chip through the conductive connection pieces. The conductive terminals are disposed on the second connection surface of the redistribution circuit structure. The conductive terminals are electrically connected to the first chip or the second chip through the redistribution circuit structure.

The manufacturing method of the package structure of the invention includes the following steps: providing a first chip; providing a second chip; forming an encapsulant covering the first chip and the second chip; forming a redistribution circuit structure electrically connected to the first chip and the second chip, the redistribution circuit structure having an opening exposing a part of the first chip and a part of the second chip; forming an insulator, at least disposed in the opening of the redistribution circuit structure and exposing the part of the first chip and the part of the second chip; forming a plurality of conductive connection pieces penetrating the insulator; disposing a third chip on the insulator, the third chip being electrically connected to the first chip and the second chip through the conductive connection pieces; and forming a plurality of conductive terminals on the redistribution circuit structure, the conductive terminals being electrically connected to the first chip or the second chip through the redistribution circuit structure.

Based on the above, the package structure of the invention can at least provide better signal transmission quality or efficiency between a plurality of chips (e.g., between the third chip and the first chip; or between the third chip and the second chip) through the conductive connection pieces penetrating the insulator.

BRIEF DESCRIPTION OF THE DRAWINGS

FIG. 3A and FIG. 3B are partial cross-sectional views of a part of a manufacturing method of a package structure according to a third embodiment of the invention.

DETAILED DESCRIPTION

Figure 1A:
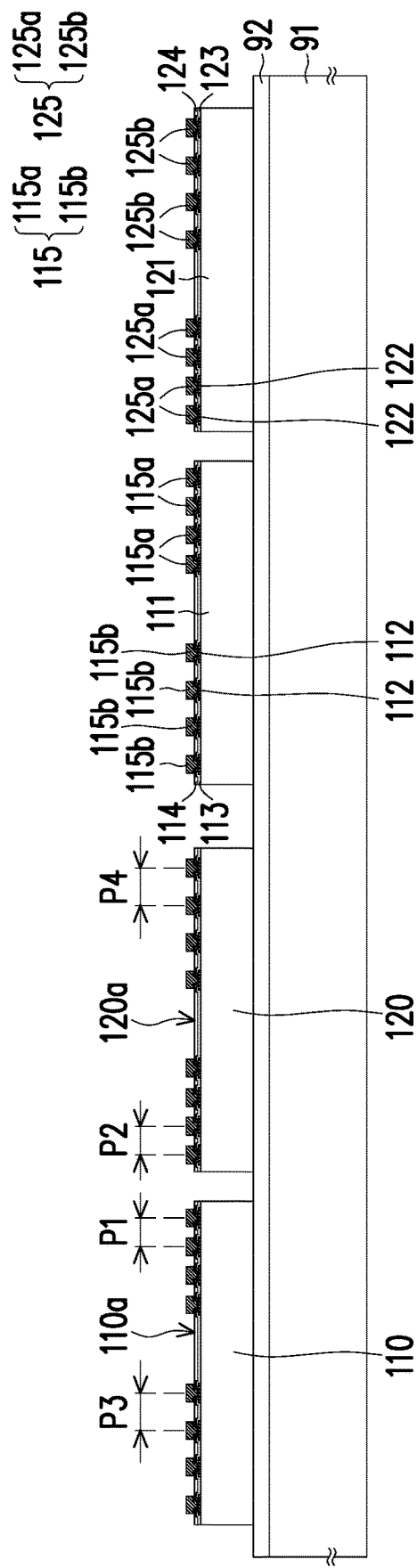
FIG. 1A to FIG. 1K are partial cross-sectional views of a part of a manufacturing method of a package structure according to a first embodiment of the invention.

Directional terminology (e.g., top, down, right, left, front, rear, top, and bottom) is used with reference to the orientation of the Figure(s) being described. As such, the directional terminology is used for purposes of illustration and is in no way limiting. In addition, for clarity, some of the film layers or members may be omitted in the drawings.

Unless otherwise clearly indicated, the method in this disclosure should not be construed as requiring steps therein to be performed in a particular order.

The invention will be described more comprehensively below with reference to the drawings for the embodiments. However, the invention may also be implemented in different forms rather than being limited by the embodiments described in the invention. Thicknesses, dimensions and sizes of layers and regions in the drawings are exaggerated for clarity. The same reference numbers are used in the drawings and the description to indicate the same or like parts, which are not repeated in the following embodiments.

FIG. 1A to FIG. 1K are partial cross-sectional views of a part of a manufacturing method of a package structure according to a first embodiment of the invention. FIG. 1L is a cross-sectional view of the package structure according to the first embodiment of the invention. FIG. 1M is a cross-sectional view of the package structure according to the first embodiment of the invention. FIG. 1N is a partial 3D view of the package structure according to the first embodiment of the invention. FIG. 1O is a partial 3D view of the package structure according to the first embodiment of the invention.

For instance, FIG. 1M is, for example, an enlarged view corresponding to a region R2 in FIG. 1L. FIG. 1N is, for example, a partial 3D view of an insulator of the package structure according to one embodiment of the invention. FIG. 1O is, for example, a partial 3D view of a conductive connection piece of the package structure according to one embodiment of the invention.

Referring to FIG. 1A, a first chip 110 is provided and a second chip 120 is provided. It should be noted that, the order of providing the first chip 110 and providing the second chip 120 is not limited in the invention.

For instance, the first chip 110 and the second chip 120 may be disposed on a carrier 91. The carrier 91 may be made of glass, wafer substrate, metal or other suitable materials, as long as the aforementioned materials can carry the structure or member formed thereon in the subsequent manufacturing process. In addition, the invention does not limit the number of the first chips 110 or the number of the second chips 120 disposed on the carrier 91. Taking FIG. 1A as an example, the number of first chips 110 disposed on the carrier 91 is, for example, two, and the number of the second chips 120 disposed on the carrier 91 is, for example, two.

In this embodiment, a release layer 92 may be provided on the carrier 91. The release layer 92 may be a light to heat conversion (LTHC) adhesive layer, but the invention is not limited thereto.

In this embodiment, the first chip 110 may include a substrate 111, a plurality of connection pads 112 and a plurality of first chip connection pieces 115. A device region (not illustrated) is provided on one side of the substrate 111, and a surface on which the device region is located may be referred to as an active surface 110a. The connection pads 112 may be disposed on the active surface 110a. The first chip connection pieces 115 may be disposed on the connection pads 112. In the general chip design, devices in the device region (devices in the device region of the first chip 110) may be electrically connected to the corresponding connection pads 112 (e.g., a part of the connection pads 112 of the first chip 110) and the corresponding chip connection pieces (e.g., a part of the first chip connection pieces 115 of the first chip 110) through a corresponding back end of line interconnect (BEOL Interconnect).

In this embodiment, the connection pad 112 is, for example, an aluminum pad or a copper pad, but the invention is not limited thereto.

In one embodiment, the connection pads 112 may be partially covered by an insulation layer 113, and the insulation layer 113 may expose a part of the connection pads 112.

In one embodiment, a passivation layer 114 may cover the insulation layer 113, and the passivation layer 114 may expose the part of the connection pads 112.

In one embodiment, the first chip connection piece 115 may be formed by a lithography process, a sputtering process, an electroplating process and/or an etching process, but the invention is not limited thereto. For example, the first chip connection piece 115 may include a seed layer 115s (marked in FIG. 1M) and a plating layer 115c (marked in FIG. 1M) disposed on the seed layer 115s, but the invention is not limited thereto.

In one embodiment not shown, a first chip connection piece (e.g., a first chip connection piece similar to the first chip connection piece 115) may include a pre-formed conductive piece. For example, the first chip connection piece may include a pre-formed conductive pillar, but the invention is not limited thereto.

In this embodiment, the first chip connection pieces 115 may include a plurality of first chip connection pieces 115a and a plurality of first chip connection pieces 115b, but the invention is not limited thereto.

In one embodiment, a pitch P1 between the first chip connection pieces 115a may be smaller than a pitch P3 between the first chip connection pieces 115b, but the invention is not limited thereto.

In this embodiment, the second chip 120 may include a substrate 121, a plurality of connection pads 122 and a plurality of second chip connection pieces 125. A device region (not illustrated) is provided on one side of the substrate 121, and a surface on which the device region is located may be referred to as an active surface 120a.

In this embodiment, the second chip 120 may be identical or similar to the first chip 110. For instance, the substrate 121 may be identical or similar to the substrate 111; the connection pads 122 may be identical or similar to the connection pads 112; an insulation layer 123 may be identical or similar to the insulation layer 113; a passivation layer 124 may be identical or similar to the passivation layer 114; the second chip connection pieces 125 may be identical or similar to the first chip connection pieces 115. Accordingly, descriptions regarding the above are not repeated hereinafter.

In this embodiment, the second chip connection pieces 125 may include a plurality of second chip connection pieces 125a and a plurality of second chip connection pieces 125b, but the invention is not limited thereto.

In one embodiment, a pitch P2 between the second chip connection pieces 125a may be smaller than a pitch P4 between the second chip connection pieces 125b, but the invention is not limited thereto.

In this embodiment, the first chip 110 and the second chip 120 may be arranged side by side. In addition, the chips are arranged in such a manner that the chip connection pieces having the smaller pitch are close to each other.

Figure 1B:
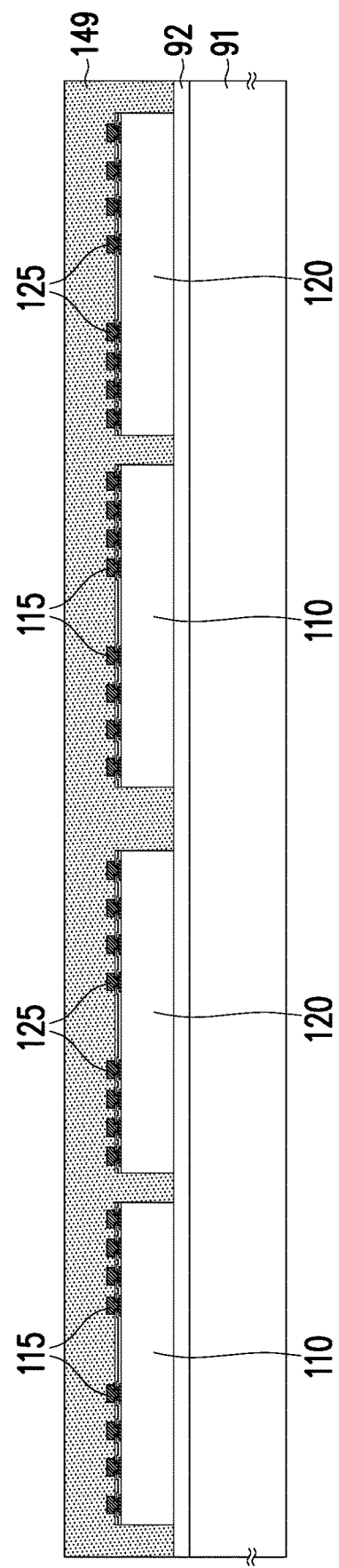
Figure 1C:
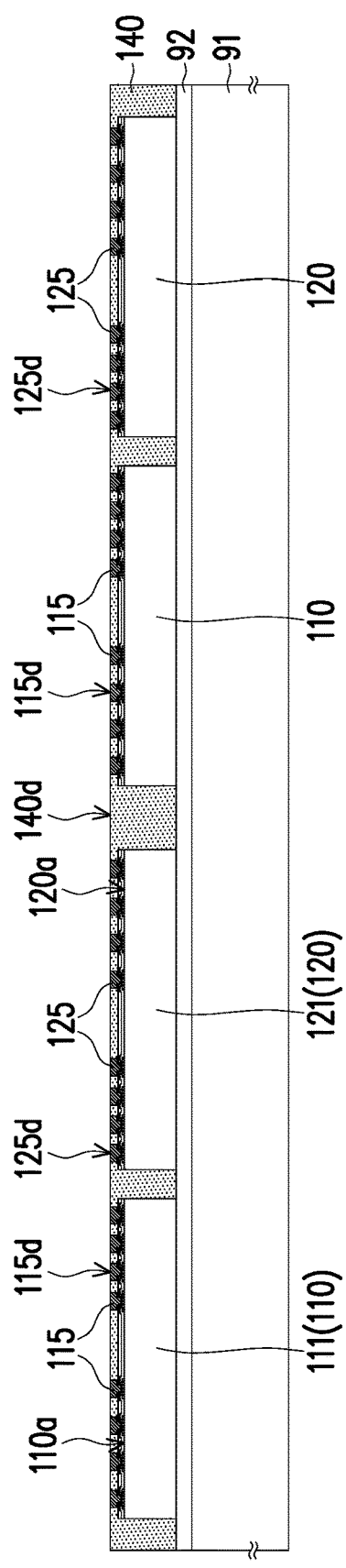

Referring to FIG. 1B and FIG. 1C, an encapsulant 140 covering the first chip 110 and the second chip 120 is formed. The encapsulant 140 may expose a part of the first chip 110 and a part of the second chip 120. For instance, the encapsulant 140 may expose the first chip connection pieces 115a and 115b of the first chip 150 and the second chip connection pieces 125a and 125b of the second chip 120.

In this embodiment, the step of forming the encapsulant 140 is exemplified as follows.

Referring to FIG. 1B, an encapsulating material 149 covering the first chip 110 and the second chip 120 may be formed. In one embodiment, the encapsulating material 149 is a molten molding compound formed on the carrier 91 by, for example, a molding process or other suitable methods. Then, the molten molding compound is cooled and cured. In one embodiment, the first chip 110 and the second chip 120 are not exposed outside the encapsulating material 149, but the invention is not limited thereto.

Referring to FIG. 1C, after the encapsulating material 149 (marked in FIG. 1B) is formed, a reducing process may be performed to remove a part of the encapsulating material 149 (marked in FIG. 1B), so as to form the encapsulant 140 laterally covering the first chip 110 and the second chip 120 and to expose the first chip connection pieces 115 of the first chip 110 and the second chip connection pieces 125 of the second chip 120.

In this embodiment, the reducing process includes, for example, a chemical mechanical polishing (CMP), a mechanical grinding, etching or other suitable processes, but the invention is not limited thereto.

In this embodiment, after going through the reducing process described above, a top surface 115d of the first chip connection piece 115, a top surface 125d of the second chip connection piece 125 and an encapsulating top surface 140d of the encapsulant 140 are substantially coplanar.

In one embodiment, in the reducing process described above, a part of the first chip connection pieces 115 (e.g., a part of the first chip connection pieces 115 away from the substrate 111) or a part of the second chip connection pieces 125 (e.g., a part of the second chip connection pieces 125 away from the substrate 121) may be slightly removed.

In one embodiment, in the reducing process described above, the first chip connection pieces 115 of the first chip 110 may reduce the possibility of damage to the active surface 110a or the device region of the first chip 110; and/or the second chip connection pieces 125 of the second chip 120 may reduce the possibility of damage to the active surface 120a or a device region of the second chip 120.

Figure 1D:
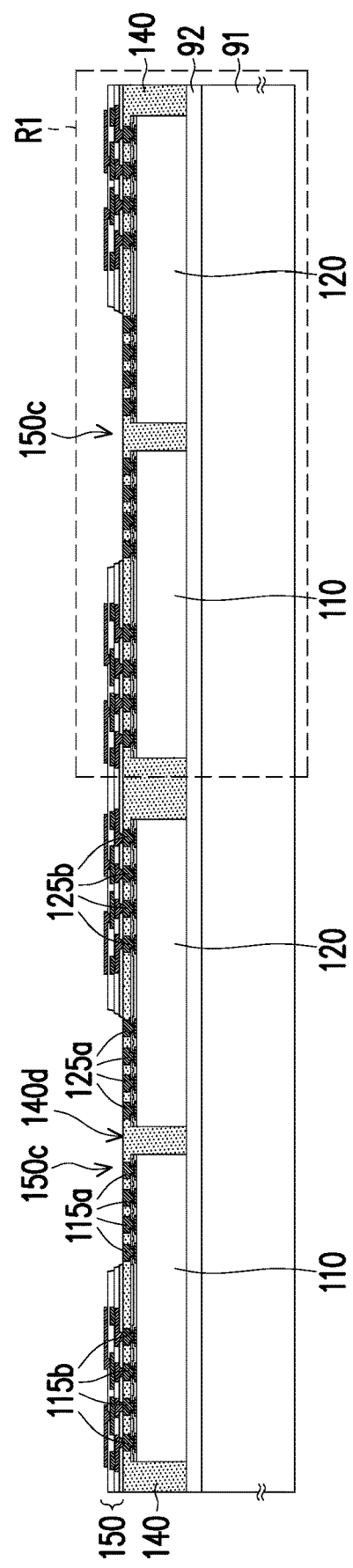

Referring to FIG. 1D, a redistribution circuit structure 150 electrically connected to the first chip 110 and the second chip 120 is formed, and the redistribution circuit structure 150 has an opening 150c exposing a part of the first chip 110 and a part of the second chip 120 and a part of the encapsulant 140. For instance, the opening 150c of the redistribution circuit structure 150 may expose a part of the first chip connection pieces 115 (e.g., the first chip connection pieces 115a) of the first chip 110, a part of the second chip connection pieces 125 (e.g., the second chip connection pieces 125a) of the second chip 120 and the encapsulating top surface 140d of the encapsulant 140.

Figure 1E:
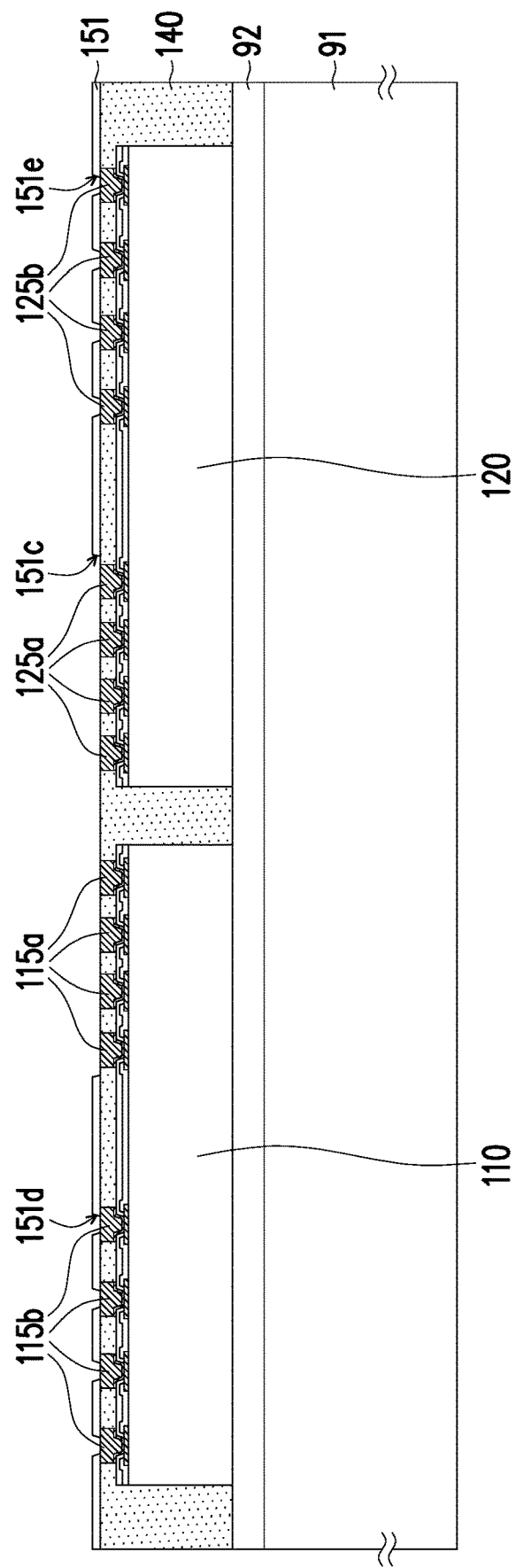
Figure 1F:
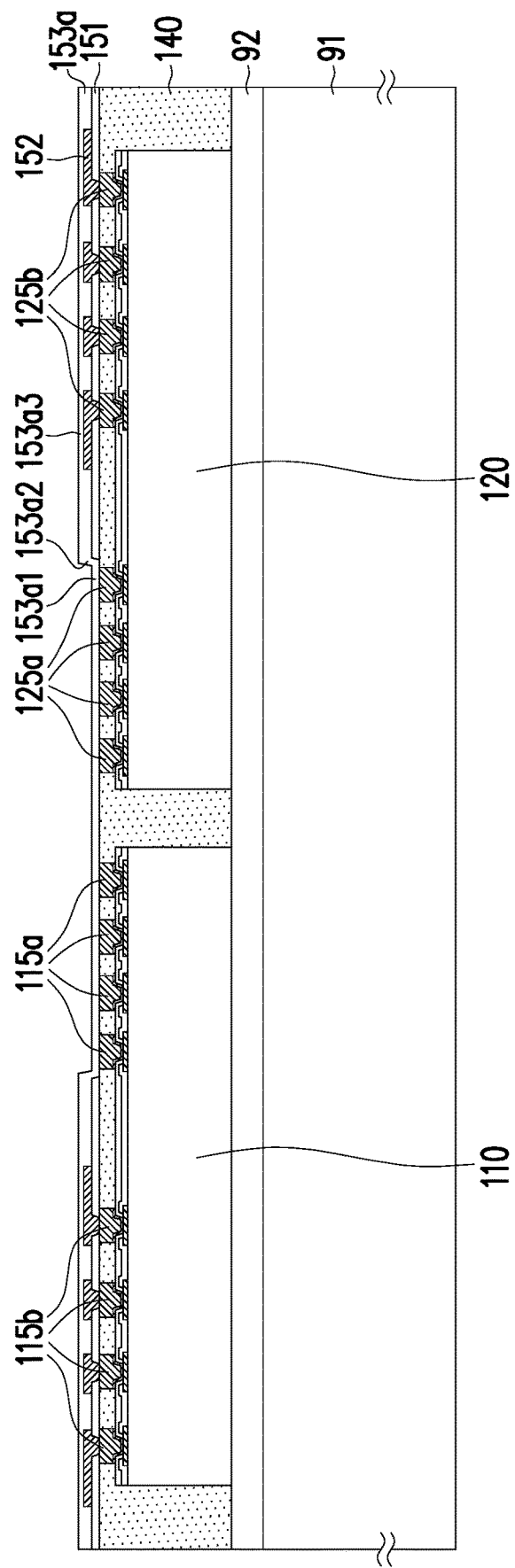
Figure 1G:
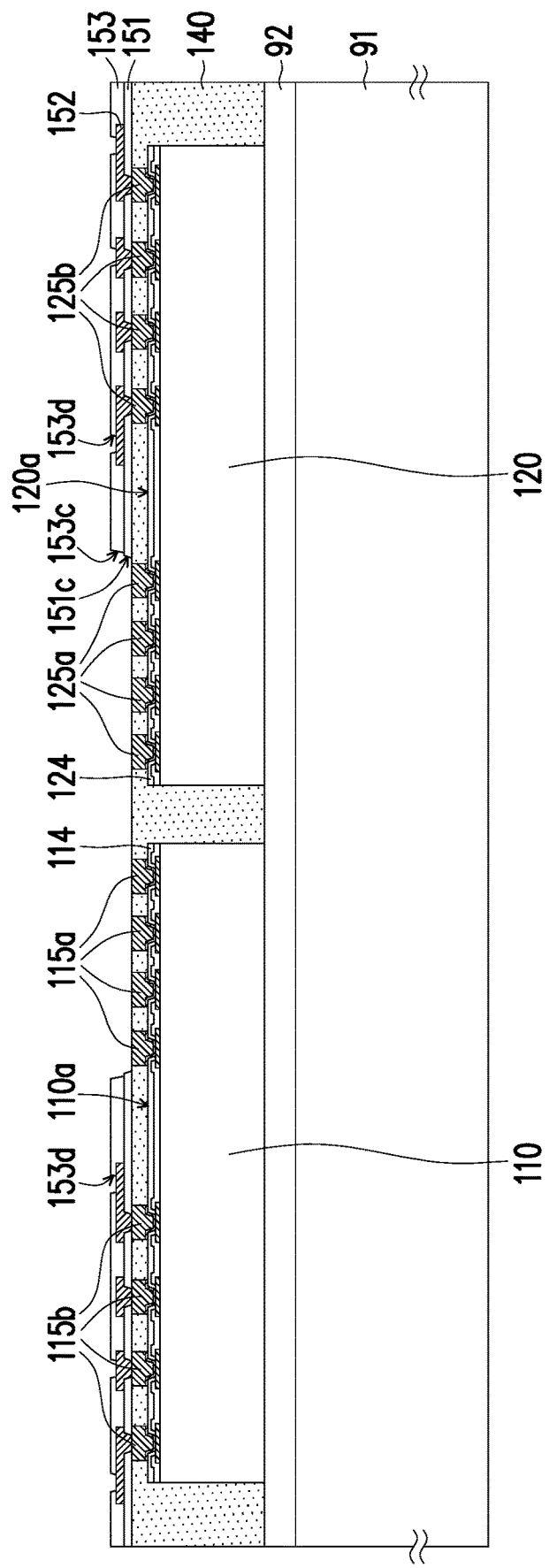

Referring to FIG. 1D and FIG. 1E to FIG. 1G together, FIG. 1E to 1G may be schematic diagrams corresponding to steps for the region R1 in FIG. 1D. In this embodiment, the step of forming the redistribution circuit structure 150 having the opening 150c is exemplified as follows.

Referring to FIG. 1E, a first insulation layer 151 is formed on the encapsulant 140. The first insulation layer 151 has a first opening 151c exposing the first chip connection pieces 115a of the first chip 110 and the second chip connection pieces 125a of the second chip 120.

In one embodiment, a first insulation material layer may be formed on the encapsulant 140 by a deposition process or other suitable processes. A material of the first insulation material layer may include an inorganic material (e.g., a silicon oxide, a silicon nitride, a silicon oxynitride, other suitable materials, or a stacked layer of at least two inorganic materials above), an organic material (e.g., polyimide (PI), polybenzoxazole (PBO), or a stacked layer of at least two organic materials above) or other suitable insulation materials (e.g., a stacked or mixed layer of at least one inorganic material and at least one organic material above). Then, for example, the first insulation layer 151 having openings 151c, 151d and 151e may be formed by patterning the first insulation material layer through lithography and etching processes. The first opening 151c may expose the first chip connection pieces 115a of the first chip 110 and the second chip connection pieces 125a of the second chip 120; the opening 151d may expose the first chip connection pieces 115b of the first chip 110; and the opening 151e may expose the second chip connection pieces 125b of the second chip 120.

Referring to FIG. 1F, after the first insulation layer 151 is formed, a circuit layer 152 may be formed on the first insulation layer 151. The circuit layer 152 may be formed by other suitable processes such as a commonly used deposition process and/or an electroplating process, which are not repeated hereinafter. The circuit layer 152 may be filled in the opening 151d to be electrically connected to the first chip connection pieces 115b. The circuit layer 152 may be filled in the opening 151e to be electrically connected to the second chip connection pieces 125b.

Referring to FIG. 1F again, after the circuit layer 152 is formed, a second insulation material layer 153a may be formed on the first insulation layer 151. The second insulation material layer 153a may cover the circuit layer 152, and the second insulation material layer 153a may be further filled in the first opening 151c (marked in FIG. 1E). The second insulation material layer 153a may cover and directly contact the first chip connection pieces 115a and the second chip connection pieces 125a. A material or a forming method of the second insulation material layer 153a may be identical or similar to the material or the forming method of the first insulation material layer described above, which are not repeated hereinafter.

Referring to FIG. 1G, a part of the second insulation material layer 153a (marked in FIG. 1F) is removed to form a second insulation layer 153 having a second opening 153c. For instance, the second insulation layer 153 having openings 153c and 153d may be formed by patterning the second insulation material layer 153a through lithography and etching processes. The second opening 153c may expose the first chip connection pieces 115a of the first chip 110 and the second chip connection pieces 125a of the second chip 120, and the opening 153d may expose a part of the circuit layer 152.

In one embodiment, in the step of forming the second opening 153c of the second insulation layer 153, a part of the first insulation layer 151 (e.g., a region near the first opening 151c) may be slightly removed.

In one embodiment, the redistribution circuit structure 150 having the opening 150c may be formed by the same or similar steps as in FIG. 1F and FIG. 1G.

In one embodiment, among the openings of each insulation layer for exposing the first chip connection pieces 115a and the second chip connection pieces 125a, the opening of the insulation layer formed later overlaps with the opening of the insulation layer formed earlier. Moreover, the steps of removing a part of the insulation material layer to expose the chip connection pieces and the corresponding circuit layer are completed through the same wet etching process. That is to say, in the wet etching process described above, thicknesses and materials of the part of the insulation material layer to be removed are substantially similar or identical. Taking FIG. 1F and FIG. 1G for example, the second opening 153c of the second insulation layer 153 overlaps with the first opening 151c of the first insulation layer 151. Further, the steps of removing a part of the second insulation material layer 153a to form the second opening 153c (i.e., to expose the first chip connection pieces 115a and the second chip connection pieces 125a) and the opening 153d (i.e., to expose a part of the circuit layer 152) are completed through the same wet etching process. Thicknesses and materials of a part of the second insulation material layer 153a1 filled in the first opening 151c, a part of the second insulation material layer 153a2 adjacent to the first opening 151c (e.g., a part of the second insulation material layer 153a above the first insulation layer 151 constituting an edge of the first opening 151c) and/or a part of the second insulation material layer 153a3 disposed on the circuit layer 152 are substantially similar or identical. In this way, in the wet etching process described above, the possibility of undercut or film peeling caused by a lateral etching may be reduced.

In one embodiment, among the openings of each insulation layer for exposing the chip connection pieces, an opening aperture of the opening of the insulation layer formed later is greater than an opening aperture of the opening of the insulation layer formed earlier. Taking FIG. 1F and FIG. 1G for example, an opening aperture of the second opening 153c is greater than an opening aperture of the first opening 151c. In this way, during the wet etching processes performed multiple time for forming the opening 150c of the redistribution circuit structure 150 (e.g., an alignment step before etching; and/or the setting of etching parameters), a process window may be improved.

In one embodiment, during the wet etching processes performed multiple time for forming the opening 150c of the redistribution circuit structure 150, the first chip connection pieces 115a of the first chip 110, a part of the encapsulant 140 disposed on the active surface 110a of the first chip 110 and/or the passivation layer 114 of the first chip 110 may reduce the possibility of damage to the active surface 110a or the device region of the first chip 110; and/or the second chip connection pieces 125a of the second chip 120, a part of the encapsulant 140 disposed on the active surface 120a of the second chip 120 and/or the passivation layer 124 of the second chip 120 may reduce the possibility of damage to the active surface 120a or the device region of the second chip 120.

Figure 1H:
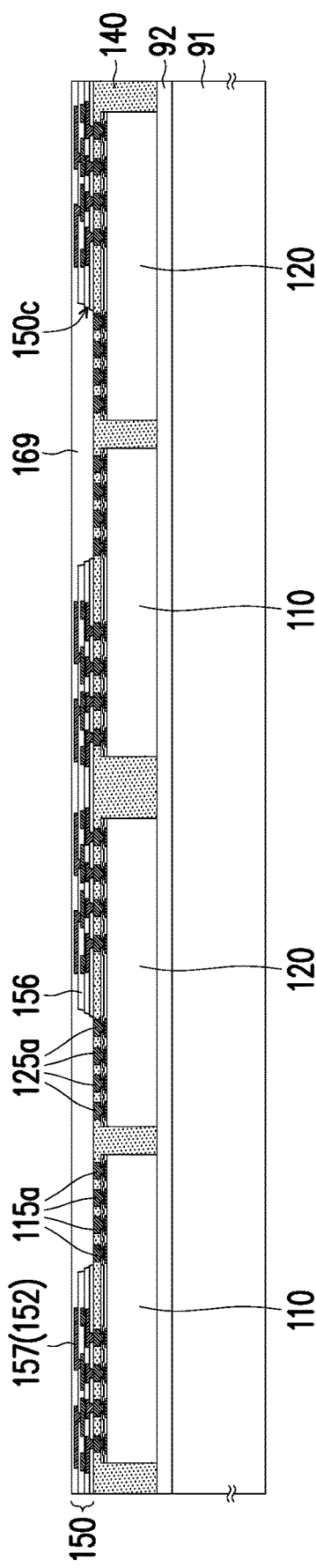

Referring to FIG. 1H, in this embodiment, an insulation material 169 covering the redistribution circuit structure 150 may be formed. In some embodiments, the insulation material 169 includes an organic material. For example, the insulation material 169 may include an organic photosensitive dielectric material (PID material). In one embodiment, the insulation material 169 may be formed by a coating method or other suitable processes, but the invention is not limited thereto.

In this embodiment, the insulation material 169 is at least filled in the opening 150c of the redistribution circuit structure 150, and covers the first chip connection pieces 115a of the first chip 110 and the second chip connection pieces 125a of the second chip 120. In other words, an outer shape of the insulation material 169 filled in the opening 150c is substantially corresponding to an inner shape of the opening 150c. In one embodiment, the insulation material 169 may further cover a topmost circuit layer 157 of the redistribution circuit structure 150 (i.e., a circuit layer that is farthest from the first chip 110 or the second chip 120 in the redistribution circuit structure 150) or a topmost insulation layer 156 (i.e., an insulation layer that is farthest from the first chip 110 or the second chip 120 in the redistribution circuit structure 150) of the redistribution circuit structure 150.

Figure 1I:
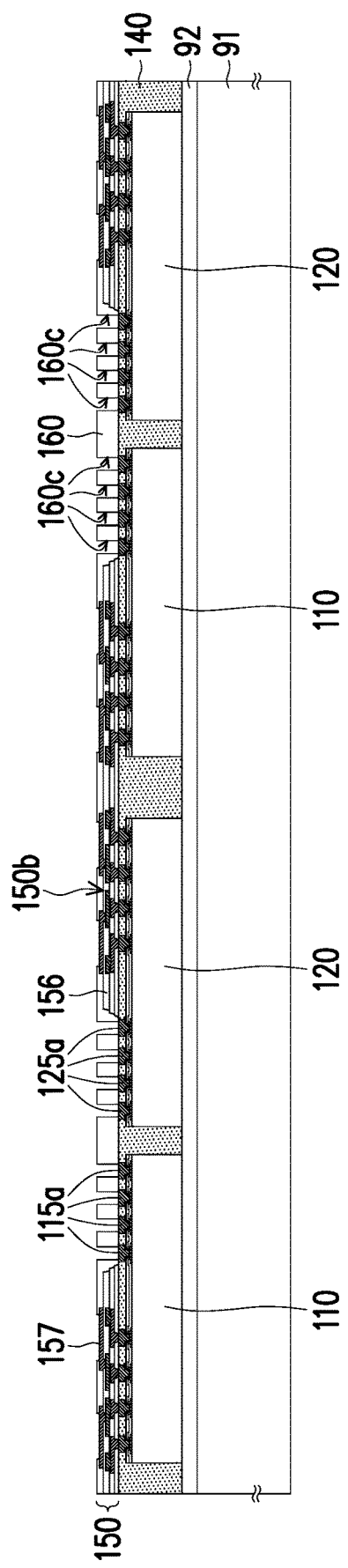

Referring to FIG. 1I, an insulator 160 is formed. The insulator 160 is at least disposed in the opening 150c of the redistribution circuit structure 150, and the insulator 160 exposes the first chip connection pieces 115a of the first chip 110 and the second chip connection pieces 125a of the second chip 120.

In this embodiment, a part of the insulation material 169 (marked in FIG. 1H) may be cured by photopolymerization and/or baking processes. Then, a remaining part of the insulation material 169 not cured may be removed by a wet clean or other suitable methods. In this way, the insulator 160 having a plurality of through holes 160c may be formed. The through holes 160c of the insulator 160 may expose the first chip connection pieces 115a of the first chip 110 and the second chip connection pieces 125a of the second chip 120.

In one embodiment, it is possible that the through holes 160c of the insulator 160 do not expose the encapsulant 140, but the invention is not limited thereto.

In this embodiment, the insulator 160 may be further disposed on a surface of the redistribution circuit structure 150 (e.g., a second connection surface 150b constituted by an outer surface of the topmost insulation layer 156 and an outer surface of the topmost circuit layer 157), and the insulator 160 may further expose a part of the topmost circuit layer 157 of the redistribution circuit structure 150.

Figure 1J:
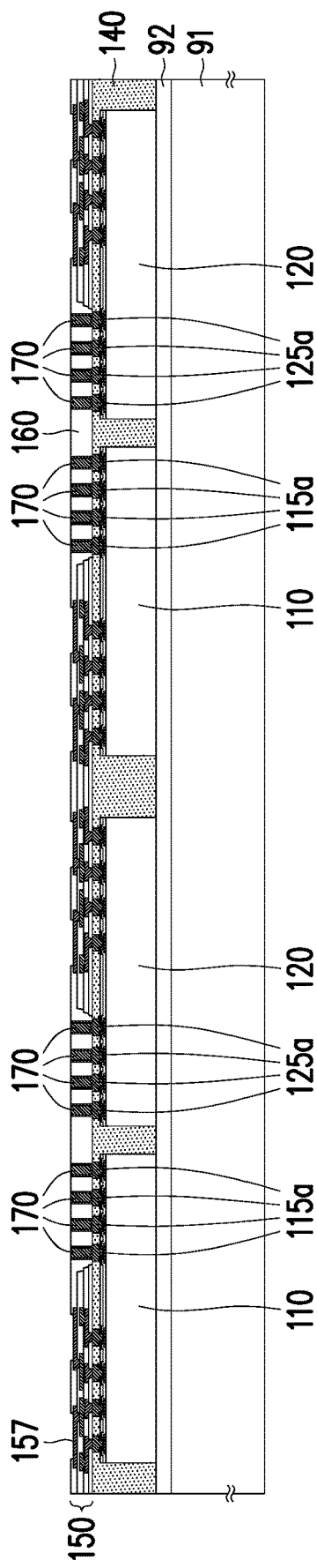

Referring to FIG. 1J, a plurality of conductive connection pieces 170 are formed. The conductive connection pieces 170 may be formed in the through holes 160c of the insulator 160 (marked in FIG. 1I). In other words, the conductive connection pieces 170 may penetrate the insulator 160 and may be electrically connected to the corresponding first chip connection pieces 115a or the corresponding second chip connection pieces 125a.

In one embodiment, the conductive connection pieces 170 may be formed by a lithography process, a sputtering process, an electroplating process and/or an etching process, but the invention is not limited thereto. For example, the conductive connection piece 170 may include a plating core layer 170c (marked in FIG. 1M) and a seed layer 170s (marked in FIG. 1M) surrounding the plating core layer 170c, but the invention is not limited thereto.

Figure 1K:
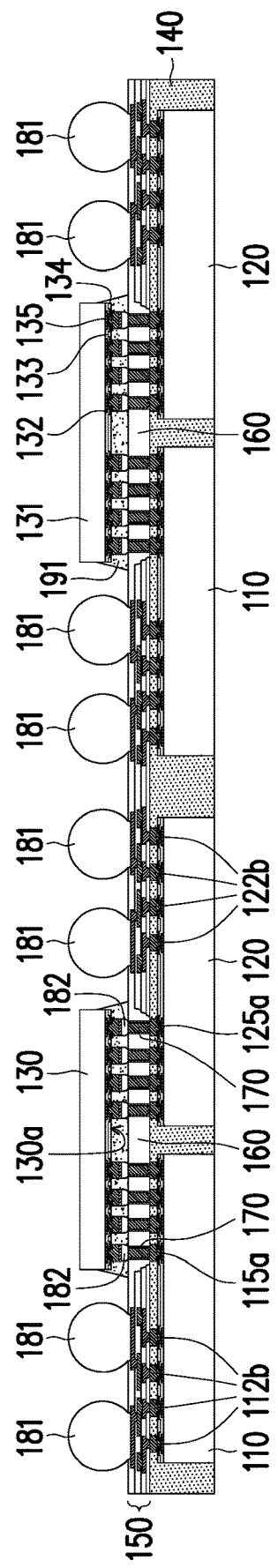
Figure 1L:
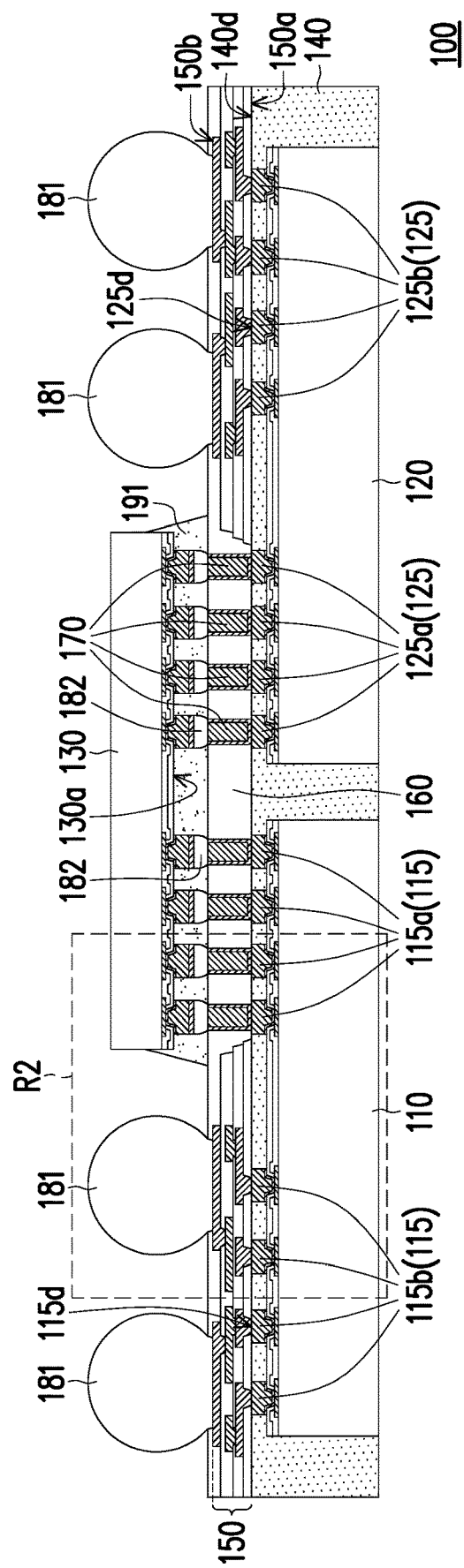
FIG. 1L is a cross-sectional view of the package structure according to the first embodiment of the invention.
Figure 1M:
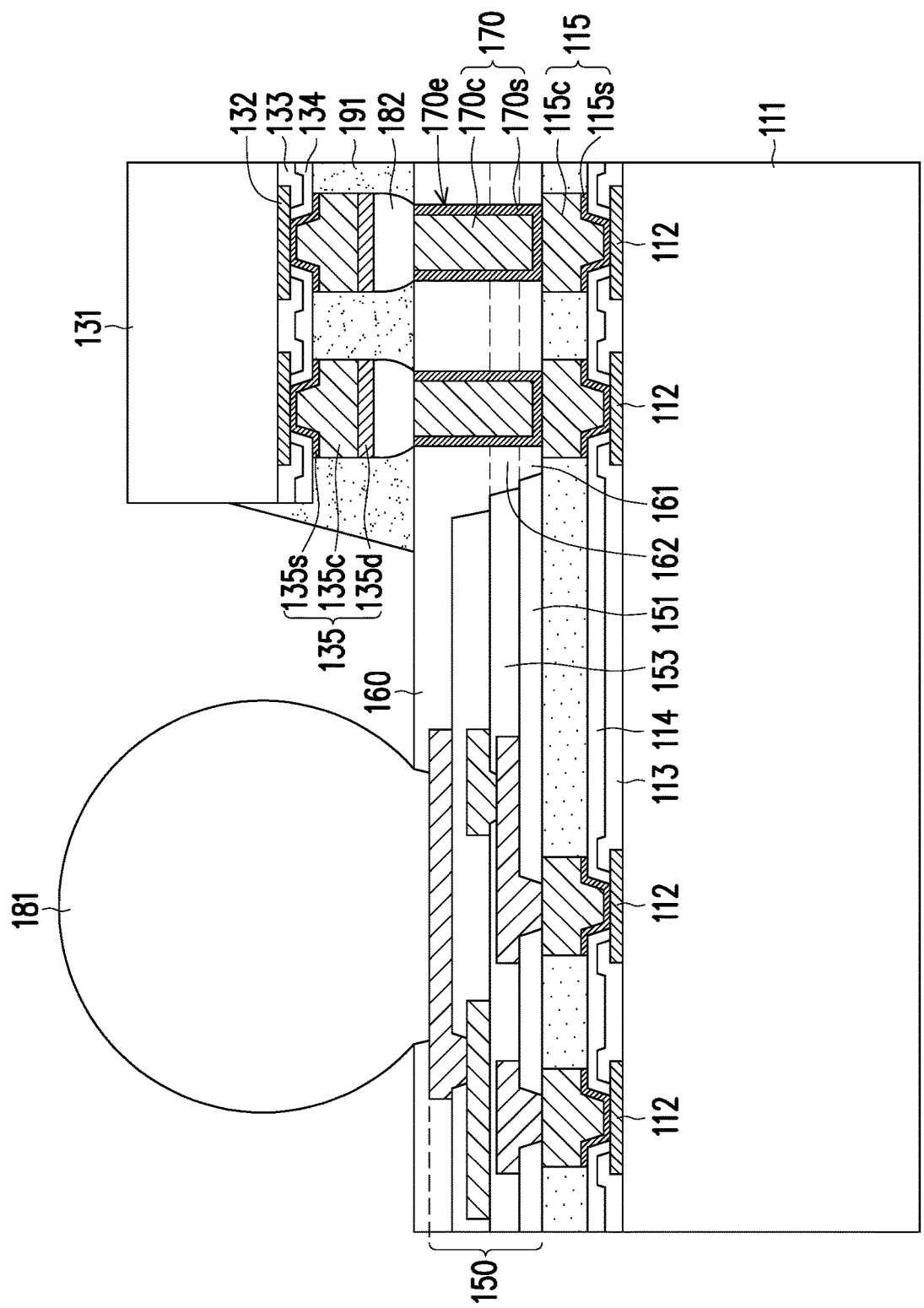
FIG. 1M is a partial cross-sectional view of the package structure according to the first embodiment of the invention.
Figure 1O:
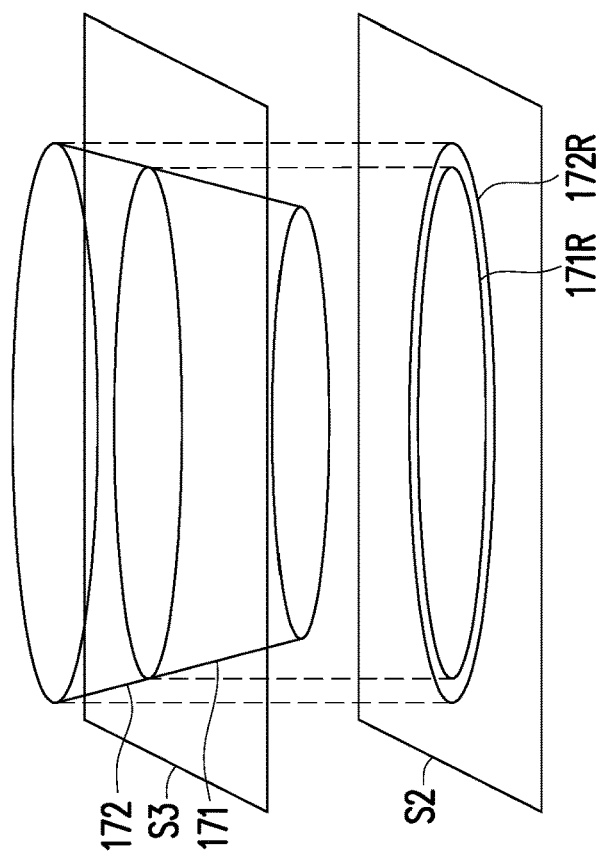
FIG. 1O is a partial 3D view of the package structure according to the first embodiment of the invention.
Figure 1N:
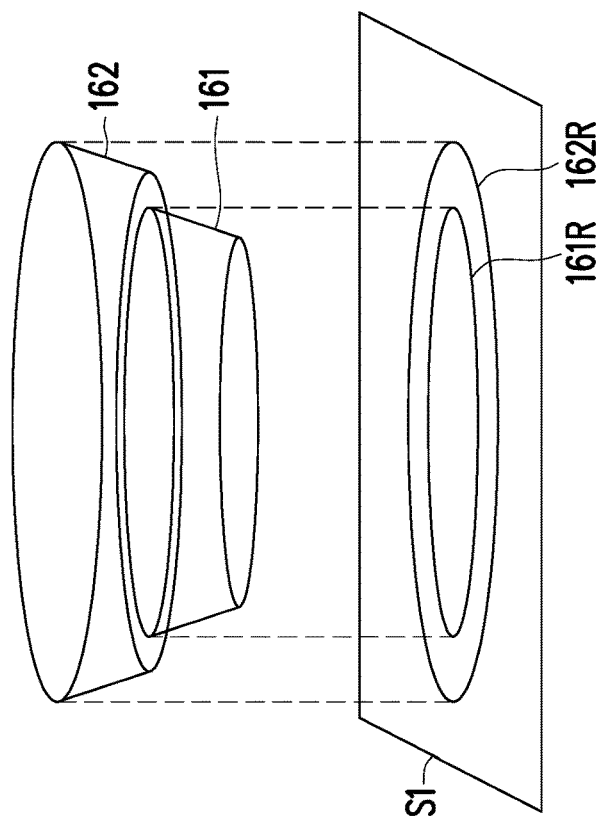
FIG. 1N is a partial 3D view of the package structure according to the first embodiment of the invention.

Referring to FIG. 1K, after the conductive connection pieces 170 are formed, the carrier 91 (marked in FIG. 1J) may be removed. In this embodiment, after the carrier 91 is removed, the first chip 110, the second chip 120 or the encapsulant 140 may be exposed.

Referring to FIG. 1K, after the conductive connection pieces 170 are formed, a third chip 130 may be disposed on the insulator 160. The third chip 130 may be electrically connected to the first chip 110 and the second chip 120 through the conductive connection pieces 170. For instance, the third chip 130 may be electrically connected to the first chip connection pieces 115a of the first chip 110 and the second chip connection piece 125a of the second chip 120 through corresponding conductive terminals 182 and the corresponding conductive connection pieces 170.

In one embodiment, the conductive terminal 182 may be a conductive pillar, a solder ball, a conductive bump, or a conductive terminal having other forms or shapes. The conductive terminals 182 may be formed through electroplating, deposition, ball placement, reflow, and/or other suitable processes.

In this embodiment, the third chip 130 may include a substrate 131, a plurality of connection pads 132 and a plurality of third chip connection pieces 135. A device region (not illustrated) is provided on one side of the substrate 131, and a surface on which the device region is located may be referred to as an active surface 130a.

In this embodiment, the third chip 130 may be identical or similar to the first chip 110. For instance, the substrate 131 may be identical or similar to the substrate 111; the connection pads 132 may be identical or similar to the connection pads 112; an insulation layer 133 may be identical or similar to the insulation layer 113; a passivation layer 134 may be identical or similar to the passivation layer 114; the third chip connection pieces 135 may be identical or similar to the first chip connection pieces 115. Accordingly, descriptions regarding the above are not repeated hereinafter. For instance, the third chip connection piece 135 may include a seed layer 135s (marked in FIG. 1M) and a plating layer 135c (marked in FIG. 1M) disposed on the seed layer 135s, but the invention is not limited thereto. In one embodiment, the third chip connection piece 135 may further include a conductive connection layer 135d (marked in FIG. 1M), but the invention is not limited thereto.

In this embodiment, an underfill 191 may be formed between the third chip 130 and the insulator 160, but the invention is not limited thereto.

Referring to FIG. 1K, after the conductive connection pieces 170 are formed, a plurality of conductive terminals 181 may be formed on the redistribution circuit structure 150. The conductive terminals 181 may be electrically connected to the first chip 110 or the second chip 120 through the redistribution circuit structure 150. For instance, the conductive terminals 181 may be electrically connected to the first chip connection pieces 115*b* of the first chip 110 and the second chip connection piece 125*b* of the second chip 120 through corresponding circuits in the redistribution circuit structure 150.

The conductive terminal 181 may be a conductive pillar, a solder ball, a conductive bump, or a conductive terminal having other forms or shapes. The conductive terminals 181 may be formed through electroplating, deposition, ball placement, reflow, and/or other suitable processes.

Referring to FIG. 1K and FIG. 1L, in this embodiment, a plurality of package structures 100 may be formed through a singulation process. The singulation process may include, for example, a dicing process/cutting process for cutting through the encapsulant 140 and/or the redistribution circuit structure 150.

It should be noted that, after the singulation process is performed, similar device symbols will still be used for the singulated devices. For instance, the redistribution circuit structure 150 (as shown in FIG. 1K) can be the redistribution circuit structure 150 (as shown in FIG. 1L) after singulation; the insulator 160 (as shown in FIG. 1K) may be the insulator 160 (as shown in FIG. 1L) after singulation; the conductive connection pieces 170 (as shown in FIG. 1K) may be the conductive connection pieces 170 (as shown in FIG. 1L) after singulation; the first chip 110 (as shown in FIG. 1K) may be the first chip 110 (as shown in FIG. 1L) after singulation; the second chip 120 (as shown in FIG. 1K) may be the second chip 120 (as shown in FIG. 1L) after singulation; the encapsulant 140 (as shown in FIG. 1K) may be the encapsulant 140 (as shown in FIG. 1L) after singulation; the third chip 130 (as shown in FIG. 1K) may be the third chip 130 (as shown in FIG. 1L) after singulation; the conductive terminals 181 (as shown in FIG. 1K) may be the conductive terminals 181 (as shown in FIG. 1L) after singulation; and so forth. Other singulated components will follow the same symbol rules as described above, and will not be repeated or specifically shown herein.

It is worth noting that the invention does not limit the order of removing the carrier 91 (if any), disposing the third chip 130, disposing the conductive terminals 181 and the singulation process (if any).

After the above steps, the manufacturing process of the package structure 100 of the present embodiment is substantially completed.

Referring to FIG. 1I to FIG. 1L, the package structure 100 includes the redistribution circuit structure 150, the insulator 160, the conductive connection pieces 170, the first chip 110, the second chip 120, the encapsulant 140, the third chip 130 and the conductive terminals 181. The redistribution circuit structure 150 has a first connection surface 150*a* and the second connection surface 150*b* opposite to the first connection surface 150*a*. The insulator 160 is embedded in and penetrates the redistribution circuit structure 150. The conductive connection pieces 170 penetrate the insulator 160. The first chip 110 and the second chip 120 are disposed on the first connection surface 150*a* of the redistribution circuit structure 150. The encapsulant 140 is disposed on the first connection surface 150*a* of the redistribution circuit structure 150 and at least laterally covers the first chip 110 and the second chip 120. The third chip 130 is disposed on the second connection surface 150*b* of the redistribution circuit structure 150. The third chip 130 is electrically connected to the first chip 110 and the second chip 120 through the conductive connection pieces 170. The conductive terminals 181 are disposed on the second connection surface 150*b* of the redistribution circuit structure 150. The conductive terminals 181 are electrically connected to the first chip 110 or the second chip 120 through corresponding circuits in the redistribution circuit structure 150.

In this embodiment, the third chip 130 and the first chip 110 are not electrically connected through the redistribution circuit structure 150. In other words, the conductive element for electrically connecting the third chip 130 and the first chip 110 to each other excludes any circuit layer belonging to the redistribution circuit structure 150.

In this embodiment, the third chip 130 and the second chip 120 are not electrically connected through the redistribution circuit structure 150. In other words, the conductive element for electrically connecting the third chip 130 and the second chip 120 to each other excludes any circuit layer belonging to the redistribution circuit structure 150.

In this embodiment, the redistribution circuit structure 150 includes a circuit layer (e.g., the circuit layer 152 or the circuit layer 157; marked in FIG. 1H). The circuit layer of the redistribution circuit structure 150 is not disposed between the third chip 130 and the first chip 110, and/or the circuit layer of the redistribution circuit structure 150 is not disposed between the third chip 130 and the second chip 120. For instance, it is possible that any circuit layer belonging to the redistribution circuit structure 150 is not disposed between the third chip 130 and the first chip 110 and/or between the third chip 130 and the second chip 120. In one embodiment, the circuit layer of the redistribution circuit structure 150 may be formed through identical or similar steps as shown in FIG. 1E to FIG. 1G.

In one embodiment, a signal transmission distance between the third chip 130 and the first chip 110 is substantially identical to a physical distance between the third chip 130 and the first chip 110. For instance, signals between the third chip 130 and the first chip 110 may be transmitted through corresponding conductive pieces (e.g., the corresponding conductive connection piece 170 and the corresponding conductive terminal 182), and a distance between the third chip connection piece 135 of the third chip 130 and the first chip connection piece 115*a* of the first chip 110 is substantially equal to a height or a thickness of said conductive piece (e.g., a height of the corresponding conductive connection piece 170 and a height of the corresponding conductive terminal 182). In this way, signal transmission quality and efficiency between the third chip 130 and the first chip 110 may be improved.

In one embodiment, a signal transmission distance between the third chip 130 and the second chip 120 is substantially identical to a physical distance between the third chip 130 and the second chip 120. For instance, signals between the third chip 130 and the second chip 120 may be transmitted through corresponding conductive pieces (e.g., the corresponding conductive connection piece 170 and the corresponding conductive terminal 182), and a distance between the third chip connection piece 135 of the third chip 130 and the second chip connection piece 125*a* of the second chip 120 is substantially equal to a height or a thickness of said conductive piece (e.g., a height of the corresponding conductive connection piece 170 and a height of the corresponding conductive terminal 182). In this way, signal transmission quality and efficiency between the third chip 130 and the second chip 120 may be improved.

In general, in a conductor composed of multiple conductive structures, the signal transmitted along the conductor will have a corresponding reflection signal due to the discontinuity between the multiple conductive structures (e.g., interface or impedance mismatch due to different materials or lattices). This phenomenon may be referred to as return loss. Therefore, compared to signal transmission between the chips performed by the general redistribution method, signal transmission quality and efficiency may be improved by the conductive connection pieces 170 between the third chip 130 and the first chip 110 and/or between the third chip 130 and the second chip 120.

In one embodiment, there may be a homogeneous chip the first chip 110 and the second chip 120, and there may be a heterogeneous chip between the third chip 130 and the first chip 110/the second chip 120. For instance, the first chip 110 and/or the second chip 120 are the same or similar high bandwidth memories (HBM), and the third chip 130 is an application processor (AP) or other similar processor chip, for example. However, the invention is not limited in this regard.

In this embodiment, a part of the insulator 160 may be further disposed on the second connection surface 150*b* of the redistribution circuit structure 150.

In this embodiment, the insulator 160 may include a first insulation portion 161 and a second insulation portion 162. A distance between the first insulation portion 161 and the third chip 130 is greater than a distance between the second insulation portion 162 and the third chip 130.

In this embodiment, the first insulation portion 161 may completely overlap with the second insulation portion 162. For instance, as shown in FIG. 1N, on a virtual surface S1 parallel to the first connection surface 150*a* or the second connection surface 150*b*, a projection range 161R of an edge of the first insulation portion 161 on the virtual surface S1 may be completely located within a projection range 162R of an edge of the second insulation portion 162 on the virtual surface S1. That is to say, a dimension (i.e., a corresponding projected area) of the first insulation portion 161 may be smaller than a dimension (i.e., a corresponding projected area) of the second insulation portion 162.

In this embodiment, sidewalls 170*e* of the conductive connection pieces 170 may substantially be flat surfaces. For instance, as shown by FIG. 1M or FIG. 1O, the conductive connection piece 170 may be cylindrical shaped (e.g., a cylinder) or cone shaped (e.g. a truncated cone). On a cross-section perpendicular to the first connection surface 150*a* or the second connection surface 150*b* (e.g., a plane depicted in FIG. 1M), the sidewall 170*e* of the conductive connection piece 170 may substantially be a straight line.

In one embodiment, the conductive connection piece 170 may be divided into a first conductive connection portion 171 and a second conductive connection portion 172 by a cross-section S3 parallel to the first connection surface 150*a* or the second connection surface 150*b*. The conductive connection portion 171 is closer to the redistribution circuit structure 150 than the second conductive connection portion 172. A contact area of the first conductive connection portion 171 on the cross-section S3 is substantially identical to a contact area of the second conductive connection portion 172 on the cross-section S3. Further, on a virtual surface S2 parallel to the first connection surface 150*a* or the second connection surface 150*b*, a projection range 171R of an edge of the first conductive connecting portion 171 on the virtual surface S2 may be completely located within a projection range 172R of an edge of the second conductive connecting portion 172 on the virtual surface S2.

In this embodiment, a part of the encapsulant 140 may be further disposed between the insulator 160 and the first chip 110 and between the insulator 160 and the second chip 120.

In this embodiment, the first chip 110 may include the first chip connection pieces 115, and the second chip 120 may include the second chip connection pieces 125. The encapsulant 140 may laterally cover the first chip connection pieces 115 and the second chip connection pieces 125. The top surface 115*d* of the first chip connection piece 115, the top surface 125*d* of the second chip connection piece 125, the encapsulating top surface 140*d* of the encapsulant 140 and the first connection surface 150*a* of the redistribution circuit structure 150 are substantially coplanar.

In this embodiment, since the insulator 160 and the insulation layer (e.g., the insulation layer 151, the insulation layer 153, and/or the insulation layer 156) of the redistribution circuit structure 150 are made of different materials and/or processes, these two layers/elements (e.g., the insulator 160 and the insulation layer of the redistribution circuit structure 150) are considered as two distinct layers/elements. In other words, a clear interface may be seen between these two layers/elements.

In this embodiment, there may be no clear interface in the insulator 160. In other words, even if the insulator 160 is labelled as two or more portions, there is no clear interface therebetween.

Figure 2A:
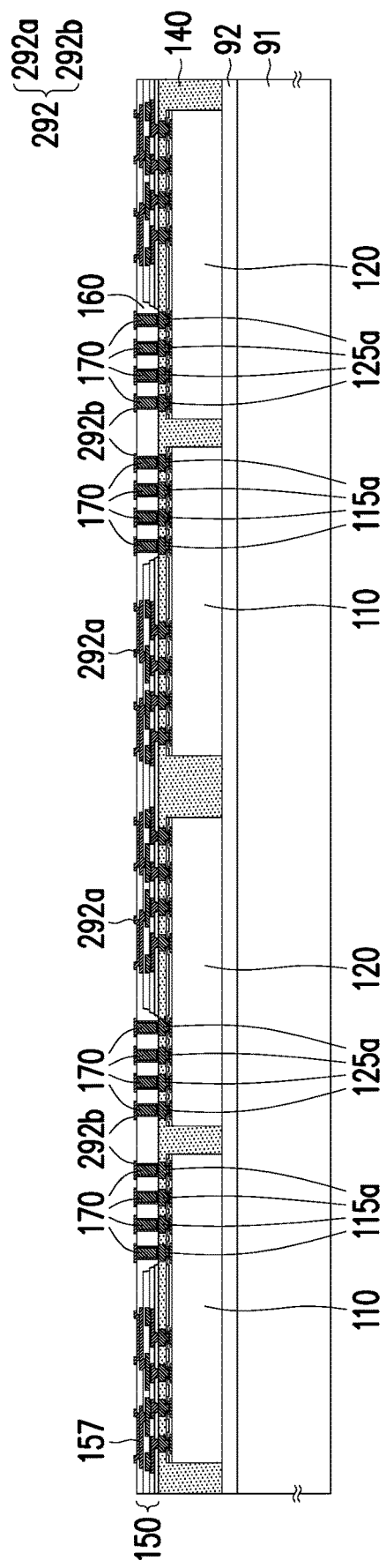
FIG. 2A is a partial cross-sectional view of a part of a manufacturing method of a package structure according to a second embodiment of the invention.
Figure 2B:
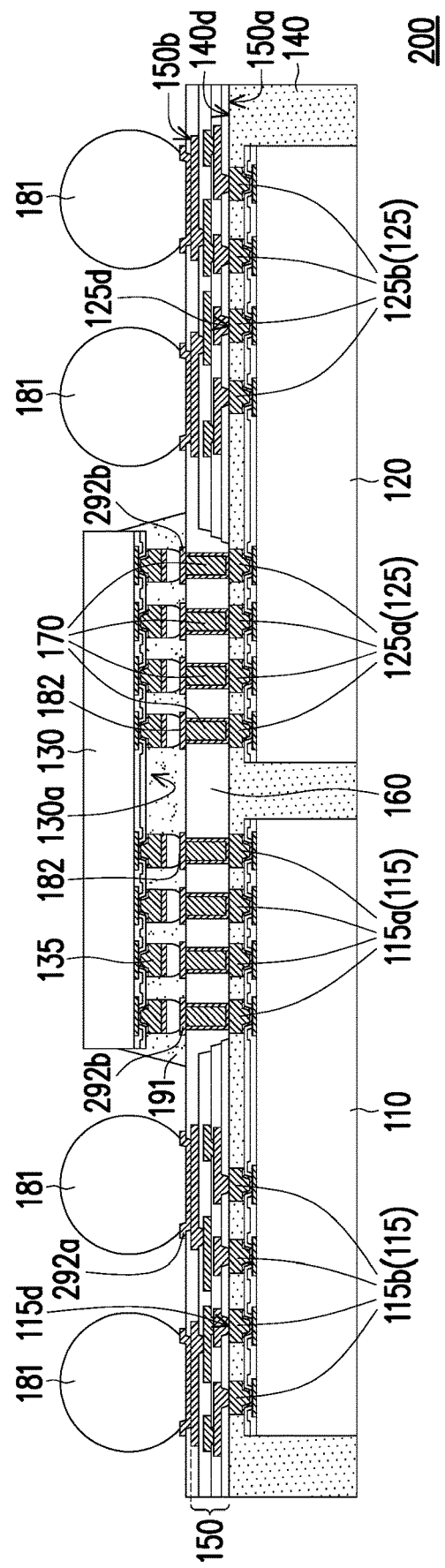
FIG. 2B is a cross-sectional view of the package structure according to the second embodiment of the invention.

FIG. 2A is a partial cross-sectional view of a part of a manufacturing method of a package structure according to a second embodiment of the invention. FIG. 2B is a cross-sectional view of the package structure according to the second embodiment of the invention. A manufacturing method of a package structure 200 of the second embodiment is similar to the manufacturing method of the package structure 100 of the first embodiment, and includes similar components denoted by the same reference numerals and having similar functions, materials or formation methods (descriptions thereof are omitted). For example, FIG. 2A is a cross-sectional view illustrating the manufacturing method of the package structure in continuation of steps of FIG. 1J.

Referring to FIG. 2A in continuation of FIG. 1J, in this embodiment, after the conductive connection pieces 170 are formed, a patterned conductive layer 292 may be formed on the insulator 160. The patterned conductive layer 292 may be electrically connected to the topmost circuit layer 157 in the redistribution circuit structure 150 or the conductive connection pieces 170.

In one embodiment, the patterned conductive layer 292 may include a patterned conductive layer 292*a*. The patterned conductive layer 292*a* may be embedded in the insulator 160 and electrically connected to the topmost circuit layer 157. In one embodiment, the patterned conductive layer 292*a* electrically connected to the topmost circuit layer 157 may be referred to as an under bump metallurgy (UBM).

In one embodiment, the patterned conductive layer 292 may include a patterned conductive layer 292*b*. The patterned conductive layer 292*b* may be electrically connected to the conductive connection pieces 170.

In this embodiment, after the patterned conductive layer 292 is formed, the package structure 200 as shown in FIG. 2B may be formed by steps identical or similar to those described in FIG. 1K.

Referring to FIG. 2B, the package structure 200 includes the redistribution circuit structure 150, the insulator 160, the conductive connection pieces 170, the first chip 110, the second chip 120, the encapsulant 140, the third chip 130, the conductive terminals 181 and the patterned conductive layer 292.

In one embodiment, the patterned conductive layer 292a may be disposed between the redistribution circuit structure 150 and the corresponding conductive terminal 181. Circuits in the redistribution circuit structure 150 may be electrically connected to the corresponding conductive terminal 181 through the corresponding patterned conductive layer 292a.

In one embodiment, the patterned conductive layer 292b may be disposed between the third chip 130 and the first chip 110, and a signal transmission distance between the third chip 130 and the first chip 110 is substantially identical to a physical distance between the third chip 130 and the first chip 110. For instance, signals between the third chip 130 and the first chip 110 may be transmitted through corresponding conductive pieces (e.g., the corresponding conductive connection piece 170, the corresponding patterned conductive layer 292b and the corresponding conductive terminal 182), and a distance between the third chip connection piece 135 of the third chip 130 and the first chip connection piece 115a of the first chip 110 is substantially equal to a height or a thickness of said conductive piece (e.g., a height of the corresponding conductive connection piece 170, a thickness of the corresponding patterned conductive layer 292b and a height of the corresponding conductive terminal 182). In this way, signal transmission quality and efficiency between the third chip 130 and the first chip 110 may be improved.

In one embodiment, the patterned conductive layer 292b may be disposed between the third chip 130 and the second chip 120, and a signal transmission distance between the third chip 130 and the second chip 120 is substantially identical to a physical distance between the third chip 130 and the second chip 120. For instance, signals between the third chip 130 and the second chip 120 may be transmitted through corresponding conductive pieces (e.g., the corresponding conductive connection piece 170, the corresponding patterned conductive layer 292b and the corresponding conductive terminal 182), and a distance between the third chip connection piece 135 of the third chip 130 and the second chip connection piece 125a of the second chip 120 is substantially equal to a height or a thickness of said conductive piece (e.g., a height of the corresponding conductive connection piece 170, a thickness of the corresponding patterned conductive layer 292b and a height of the corresponding conductive terminal 182). In this way, signal transmission quality and efficiency between the third chip 130 and the second chip 120 may be improved.

Figure 3C:
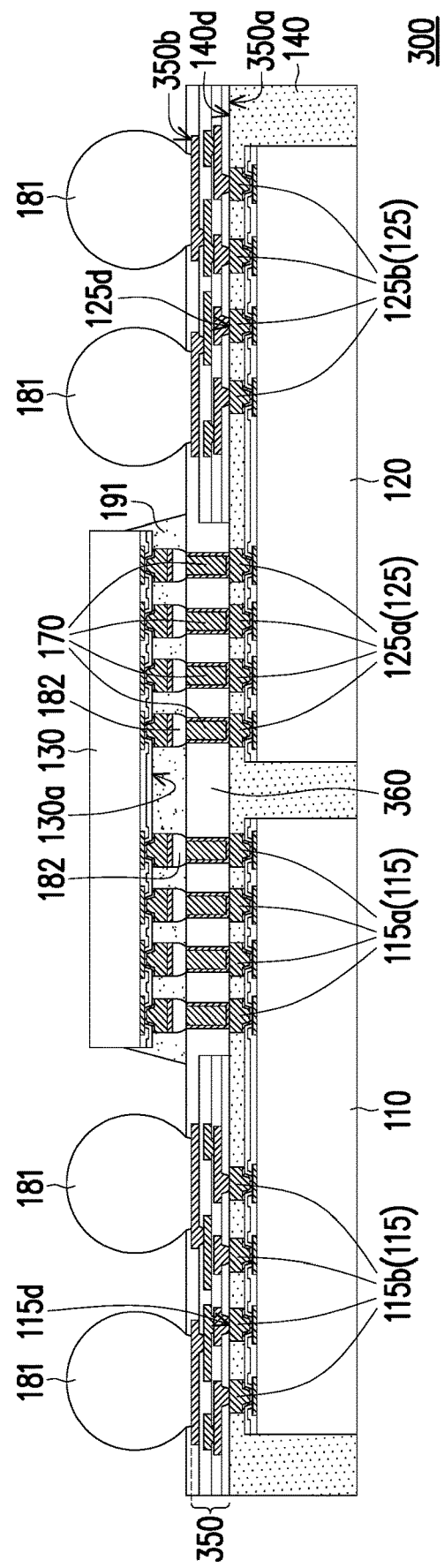
FIG. 3C is a cross-sectional view of the package structure according to the third embodiment of the invention.

FIG. 3A and FIG. 3B are partial cross-sectional views of a part of a manufacturing method of a package structure according to a third embodiment of the invention. FIG. 3C is a cross-sectional view of the package structure according to the third embodiment of the invention. A manufacturing method of a package structure 300 of the third embodiment is similar to the manufacturing method of the package structure 100 of the first embodiment, and includes similar components denoted by the same reference numerals and having similar functions, materials or formation methods (descriptions thereof are omitted). For example, FIG. 3A is a cross-sectional view illustrating the manufacturing method of the package structure in continuation of steps in FIG. 1C.

Referring to FIG. 3A in continuation of FIG. 1C, in this embodiment, a (patterned) first insulation material layer 351a may be formed on the encapsulant 140. Then, after the first insulation material layer 351a is formed, the circuit layer 152 may be formed on the first insulation material layer 351a. Then, after the circuit layer 152 is formed, a (patterned) second insulation material layer 353a may be formed on the first insulation material layer 351a. The second insulation material layer 353a may cover the circuit layer 152. Then, one or more circuit layers or one or more patterned insulation material layers may be formed in a similar manner.

Referring to FIG. 3B, after multiple patterned insulation material layers (e.g., the first insulation material layer 351a and the second insulation material 353a) are formed, a part of each insulation material layer disposed on the first chip 110 and the second chip 120 may be removed to form a redistribution circuit structure 350 having an opening 350c. The opening 350c of the redistribution circuit structure 350 exposes the first chip connection pieces 115a of the first chip 110 and the second chip connection pieces 125a of the second chip 120.

In one embodiment, a part of each insulation material layer may be removed in a one-time manner through a laser drilling, a reactive-ion etching (RIE), or other suitable wet etching processes. In other words, the step of removing a part of the first insulation material layer 351a (marked in FIG. 3A) and the step of removing a part of the second insulation material layer 353a (marked in FIG. 3A) may be the same manufacturing process.

In this embodiment, a sidewall of the opening 350c of the redistribution circuit structure 350 is substantially perpendicular to the encapsulating top surface 140d of the encapsulant 140.

In this embodiment, after the opening 350c of the redistribution circuit structure 350 is formed, the package structure 300 as shown in FIG. 3C may be formed by steps identical or similar to those described in FIG. 1H and subsequent drawings.

Referring to FIG. 3C, the package structure 300 includes the redistribution circuit structure 350, an insulator 360, the conductive connection pieces 170, the first chip 110, the second chip 120, the encapsulant 140, the third chip 130 and the conductive terminals 181 and 182. The insulator 360 is embedded in and penetrates the redistribution circuit structure 350. The conductive connection pieces 170 penetrate the insulator 360.

In this embodiment, a part of the insulator 360 may be further disposed on a second connection surface 350b of the redistribution circuit structure 350.

In this embodiment, a part of the insulator 360 disposed in the opening 350c of the redistribution circuit structure 350 (marked in FIG. 3B) may be substantially cylindrical shaped. For instance, the insulator 360 may be divided into two parts by any cross-section parallel to a first connection surface 350a or the second connection surface 350b. Further, on a virtual surface parallel to the first connection surface 350a or the second connection surface 350b, projection ranges of edges of said two parts on said virtual surface may completely overlap. That is to say, dimensions (i.e., corresponding projected areas) of said two parts may substantially be identical.

In this embodiment, a part of the encapsulant 140 may be further disposed between the insulator 360 and the first chip 110 and between the insulator 360 and the second chip 120.

In summary, the package structure of the invention can at least provide better signal transmission quality or efficiency between multiple chips (e.g., between the third chip and the first chip; or between the third chip and the second chip) through the conductive connection pieces penetrating the insulator.

The invention claimed is:

1. A package structure, comprising:
   a redistribution circuit structure, having a first connection surface and a second connection surface opposite to the first connection surface;
   an insulator, embedded in and penetrating the redistribution circuit structure;
   a plurality of conductive connection pieces, penetrating the insulator;
   a first chip, disposed on the first connection surface of the redistribution circuit structure;
   a second chip, disposed on the first connection surface of the redistribution circuit structure;
   an encapsulant, disposed on the first connection surface of the redistribution circuit structure and at least laterally covering the first chip and the second chip;
   a third chip, disposed on the second connection surface of the redistribution circuit structure, the third chip being electrically connected to the first chip and the second chip through the conductive connection pieces; and
   a plurality of conductive terminals, disposed on the second connection surface of the redistribution circuit structure, the conductive terminals being electrically connected to the first chip or the second chip through the redistribution circuit structure,
   wherein the insulator comprises a first insulation portion and a second insulation portion;
   a distance between the first insulation portion and the third chip is greater than a distance between the second insulation portion and the third chip; and
   a dimension of the first insulation portion is smaller than or equal to a dimension of the second insulation portion.

2. The package structure according to claim 1, wherein the third chip and the first chip or the third chip and the second chip are not electrically connected through the redistribution circuit structure.

3. The package structure according to claim 1, wherein the redistribution circuit structure comprises a circuit layer, and the circuit layer is not disposed between the third chip and the first chip or between the third chip and the second chip.

4. The package structure according to claim 1, wherein a part of the insulator is further disposed on the second connection surface of the redistribution circuit structure.

5. The package structure according to claim 1, wherein the first insulation portion completely overlaps with the second insulation portion.

6. The package structure according to claim 1, wherein sidewalls of the conductive connection pieces are substantially flat surfaces.

7. The package structure according to claim 1, wherein a part of the encapsulant is further disposed between the insulator and the first chip and between the insulator and the second chip.

8. The package structure according to claim 1, wherein
   the first chip comprises a first chip connection piece;
   the second chip comprises a second chip connection piece;
   the encapsulant laterally covers the first chip connection piece and the second chip connection piece; and
   a top surface of the first chip connection piece, a top surface of the second chip connection piece, an encapsulating top surface of the encapsulant and the first connection surface of the redistribution circuit structure are substantially coplanar.

9. A manufacturing method of a package structure, comprising:
   providing a first chip;
   providing a second chip;
   forming an encapsulant covering the first chip and the second chip;
   forming a redistribution circuit structure electrically connected to the first chip and the second chip, the redistribution circuit structure having an opening exposing a part of the first chip and a part of the second chip;
   forming an insulator, at least disposed in the opening of the redistribution circuit structure and exposing the part of the first chip and the part of the second chip, wherein the step of forming the insulator comprises:
      filling a photoimageable dielectric material at least in the opening of the redistribution circuit structure;
      curing a part of the photoimageable dielectric material; and
      removing a remaining part of the photoimageable dielectric material not cured to form the insulator exposing the part of the first chip and the part of the second chip;
   forming a plurality of conductive connection pieces penetrating the insulator;
   disposing a third chip on the insulator, the third chip being electrically connected to the first chip and the second chip through the conductive connection pieces; and
   forming a plurality of conductive terminals on the redistribution circuit structure, the conductive terminals being electrically connected to the first chip or the second chip through the redistribution circuit structure.

10. The manufacturing method of the package structure according to claim 9, wherein the first chip comprises a first chip connection piece, the second chip comprises a second chip connection piece, and the step of forming the encapsulant covering the first chip and the second chip comprises:
   forming an encapsulating material covering the first chip and the second chip; and
   removing a part of the encapsulating material to form the encapsulant exposing the first chip connection piece of the first chip and the second chip connection piece of the second chip such that a top surface of the first chip connection piece, a top surface of the second chip connection piece and an encapsulating top surface of the encapsulant are substantially coplanar.

11. The manufacturing method of the package structure according to claim 9, wherein the step of forming the redistribution circuit structure having the opening comprises:
   forming a first insulation layer on the encapsulant, the first insulation layer having a first opening exposing the part of the first chip and the part of the second chip;
   forming a second insulation material layer on the first insulation layer such that the second insulation material layer is further filled in the first opening; and
   removing a part of the second insulation material layer to form a second insulation layer having a second opening, wherein the second opening overlaps with the first opening.

12. The manufacturing method of the package structure according to claim 11, wherein an opening aperture of the second opening is greater than an opening aperture of the first opening.

13. The manufacturing method of the package structure according to claim 9, wherein the step of forming the redistribution circuit structure having the opening comprises:

forming a first insulation material layer on the encapsulant;

forming a second insulation material layer on the first insulation material layer; and removing a part of the first insulation material layer and a part of the second insulation material layer to expose the part of the first chip and the part of the second chip.

14. The manufacturing method of the package structure according to claim 13, wherein the step of removing the part of the first insulation material and the step of removing the part of the second insulation material layer are the same manufacturing process.

* * * * *